(12) United States Patent
Tsai

(10) Patent No.: US 10,985,725 B2
(45) Date of Patent: *Apr. 20, 2021

(54) ON-CHIP DIPLEXER

(71) Applicant: Taiwan Semiconductor Manufacturing Co., Ltd., Hsinchu (TW)

(72) Inventor: Ming-Hsien Tsai, New Taipei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/823,126

(22) Filed: Mar. 18, 2020

(65) Prior Publication Data

US 2020/0220517 A1  Jul. 9, 2020

Related U.S. Application Data

(63) Continuation of application No. 15/882,561, filed on Jan. 29, 2018, now Pat. No. 10,622,963.

(Continued)

(51) Int. Cl.
  *H03H 7/46* (2006.01)
  *H04B 1/00* (2006.01)
  (Continued)

(52) U.S. Cl.
  CPC .......... *H03H 7/463* (2013.01); *H03H 7/0115* (2013.01); *H03H 7/0123* (2013.01);
  (Continued)

(58) Field of Classification Search
  CPC .... H03H 7/463; H03H 7/0115; H03H 7/0123; H03H 7/0153; H03H 7/1741;
  (Continued)

(56) References Cited

U.S. PATENT DOCUMENTS 5,880,649 A  3/1999 Tai
6,366,564 B1  4/2002 Hiraka et al.
(Continued)

OTHER PUBLICATIONS

Chen, C.H. et al., "Novel 3D Space Partition Method for Triple WiMax Multilayer LTCC Diplexer IPD Design With EM Coupling Sensitivity Concerns", IEEE, TENCON, 2007, 4 pages.
(Continued)

*Primary Examiner* — Robert J Pascal
*Assistant Examiner* — Kimberly E Glenn
(74) *Attorney, Agent, or Firm* — Duane Morris LLP

(57) ABSTRACT

According to some embodiments, an on-chip diplexer circuit is disclosed. The on-chip diplexer circuit includes a LC resonator module, the LC resonator module further comprises a first port, a first LC resonator unit and a second LC resonator unit; a first filter unit, the first filter unit is electrically connected to the first LC resonator unit in the LC resonator module, and the first filter unit is electrically connected to a second port; and a second filter unit, the second filter unit is electrically connected to the second LC resonator unit in the LC resonator module, and the second filter unit is electrically connected to a third port. According to some embodiments, the first LC resonator unit serves as an impedance matching circuit for a first signal having a first resonant frequency and serves as an open circuit for a second signal having a second resonant frequency that is different from the first resonant frequency; the second LC resonator unit serves as an impedance matching circuit for the second signal having the second resonant frequency and serves as an open circuit for the first signal having the first resonant frequency. The first filter unit passes signals with the first resonant frequency; and the second filter unit passes signals with the second resonant frequency.

19 Claims, 12 Drawing Sheets

Related U.S. Application Data

(60) Provisional application No. 62/592,277, filed on Nov. 29, 2017.

(51) Int. Cl.
  *H03H 7/01* (2006.01)
  *H03H 7/38* (2006.01)
  *H03H 1/00* (2006.01)

(52) U.S. Cl.
  CPC ........ *H03H 7/0153* (2013.01); *H03H 7/1741* (2013.01); *H03H 7/1766* (2013.01); *H03H 7/38* (2013.01); *H04B 1/0057* (2013.01); *H03H 2001/0021* (2013.01); *H03H 2001/0078* (2013.01); *H03H 2001/0085* (2013.01); *H03H 2007/386* (2013.01)

(58) Field of Classification Search
  CPC .................. H03H 7/1766; H03H 7/38; H03H 2001/0021; H03H 2001/0078; H03H 2001/0085; H03H 2007/386; H04B 1/0057
  See application file for complete search history.

(56) References Cited

U.S. PATENT DOCUMENTS

| | | | |
|---|---|---|---|
| 10,622,963 B2* | 4/2020 | Tsai | H03H 7/0123 |
| 2002/0163399 A1 | 11/2002 | Kang et al. | |
| 2006/0006960 A1* | 1/2006 | Lin | H03H 7/463 |
| | | | 333/132 |
| 2014/0273887 A1* | 9/2014 | Black | H04B 1/40 |
| | | | 455/77 |
| 2016/0119017 A1 | 4/2016 | Xu et al. | |

OTHER PUBLICATIONS

Hsieh, S.C. et al., "Compact Size and Low Profile IPD Diplexer Design Applied on Wireless Module of Mobile Phone", 17 International Conference on Electronic Packaging Technology, 2016, pp. 551-554.

Oshima, S. et al., "A Wideband Diplexer using Multilayer Inductors for Compact Wireless LTCC Modules", Proceedings of Asia-Pacific Microwave Conference, 2014, WE3A-2, pp. 91-93.

\* cited by examiner

ON-CHIP DIPLEXER

CROSS-REFERENCE TO RELATED APPLICATION

The present application is a continuation of U.S. patent application Ser. No. 15/882,561, filed on Jan. 29, 2018, which claims priority to U.S. Provisional Patent Application No. 62/592,277, filed on Nov. 29, 2017, each of which is incorporated by reference herein in its entirety.

BACKGROUND

A system-in-a-package (SiP) is a number of integrated circuits enclosed in a single package. The SiP performs all or most of the functions of electronic systems, and is typically implemented inside mobile devices such as mobile phones, mobile digital music players, etc. To create a SiP, semiconductor dies or chips containing integrated circuits are typically stacked vertically on a substrate. The integrated circuits are internally connected by fine wires that are bonded to the package. Alternatively, with a flip chip technology, solder bumps are used to join stacked chips together.

Chip-On-Wafer-On-Substrate (CoWoS) advanced packaging technology integrates logic computing and memory chips in a three-dimensional (3D) architecture for advanced products targeting cloud computing, data center, and super computer applications. CoWoS 3-D integration facilitates power-efficient high speed computing while reducing heat emissions.

A diplexer is a passive device that implements frequency-domain multiplexing. Two ports (e.g., L and H) are multiplexed onto a third port (e.g., S). The signals on ports L and H occupy disjoint frequency bands. As a result, the signals on L and H can coexist on port S without interfering with each other. Typically, the signal on port L will occupy a single low frequency band and the signal on port H will occupy a higher frequency band. In that situation, the diplexer consists of a low pass filter connecting ports L and S and a high pass filter connecting ports H and S. Ideally, all the low band signal power on port L is transferred to the S port and vice versa. All the high band signal power on port H is transferred to port S and vice versa. Ideally, the separation of the signals is complete. None of the low band signal is transferred from the L port to the H port. In practice, some power is lost, and some signal power from one port can leak to the other port.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EXEMPLARY EMBODIMENTS

Figure 1:
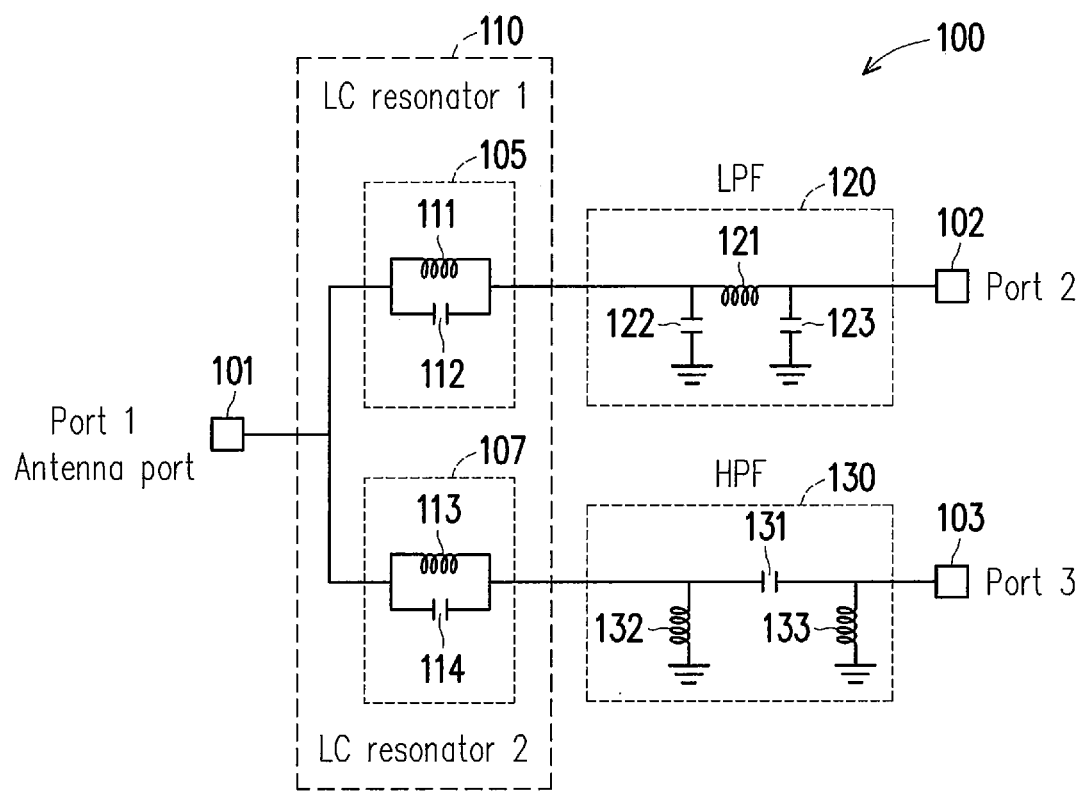
FIG. 1 is a schematic illustration of an on-chip diplexer circuit, in accordance with some embodiments.

The following disclosure describes various embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic illustration of an on-chip diplexer circuit, in accordance with some embodiments. A diplexer is used to combine and/or split the signals received from a common antenna, which acts like a switch when used in a wireless module by separating signals to low-band and high-band channels in a wireless communication system. To satisfy the requirement of operating in different bands, a wide band can be divided into smaller sub-bands by using filters to define each sub-band. In order to achieve the isolated response between two or more bands, filter selectivity is maintained. In order to make two filters function well in the designed passband, input impedance matching is implemented at each of the frequency bands. According to some embodiments, an on-chip diplexer circuit 100 is a dual-mode three port matching circuit. According to some embodiments, the on-chip diplexer circuit 100 includes a first input port 101, a first output port 102, a second output port 103, a LC resonator module 110, a first filter unit 120 and a second filter unit 130. The LC resonator module 110 further includes the first input port 101, a first LC resonator unit 105 and a second LC resonator unit 107. The first filter unit 120 is electrically connected to the first LC resonator unit 105 in the LC resonator module 110, and the first filter unit 120 is electrically connected to the second port 102. The second filter unit 130 is electrically connected to the second LC resonator unit 107 in the LC resonator module 110, and the second filter unit 130 is electrically connected to the third port 103.

According to some embodiments, the first LC resonator unit 105 in the LC resonator module 110 further includes a first inductor 111 connected in parallel to a first capacitor 112. According to some embodiments, the second LC resonator unit 107 in the LC resonator module 110 further includes a second inductor 113 connected in parallel to a second capacitor 114. The first LC resonator unit 105 is implemented for low band pass coupled to low pass filter 120. The second LC resonator unit 107 is implemented for high band pass coupled to high pass filter 130. According to some embodiments, the first filter unit 120 is a low pass filter (LPF) and the second filter unit 130 is a high pass filter (HPF).

According to some embodiments, the LPF 120 further includes a third inductor 121, a third capacitor 122 and a fourth capacitor 123. The third capacitor 121 is electrically connected between a first side of the third inductor 121 and the ground, and the fourth capacitor 123 is electrically connected between a second side of the third inductor 121 and the ground. According to some embodiments, the HPF 130 further includes a fifth capacitor 131, a fourth inductor 132 and a fifth inductor 133. The fourth inductor 132 is electrically connected between a first side of the fifth capacitor 131 and the ground, and the fifth inductor 133 is electrically connected between a second side of the fifth capacitor 131 and the ground. According to some embodiments, the first input port 101 is an antenna port, the first output port 102 is for outputting low band signal, and the second output port 103 is for outputting high band signal.

In this embodiment, the on-chip diplexer circuit 100 is a dual-mode three port matching circuit that can separate the input signal from port 1 101 to two different paths. While the input signal may cover a wideband including both low-band and high-band, the signal is separated to different frequency bands at port 2 and port 3 respectively. In one example, the nominal impedance is 50 ohm for both the first LC resonator unit 105 and the second LC resonator unit 107. Then, the first LC resonator unit 105 is equivalent to a 50 ohm circuit for a low-band signal but resembles an open circuit for a high-band signal. This means the first LC resonator unit 105 serves as a low-pass filter that allows the low-band signal, but not the high-band signal, to pass. In contrast, the second LC resonator unit 107 is equivalent to an open circuit for a low-band signal but is equivalent to a 50 ohm circuit for a high-band signal. That is, the second LC resonator unit 107 serves as a high-pass filter that allows the high-band signal, but not the low-band signal, to pass.

As such, the first LC resonator unit 105 is matched and connected to the LPF 120, so that a low-band signal can pass from port 1 101 to port 2 102, but not to port 3 103. The second LC resonator unit 107 is matched and connected to the HPF 130, so that a high-band signal can pass from port 1 101 to port 3 103, but not to port 2 102. In one example, by the reflection-less matching or maximum power transfer matching, the load impedances of the LPF 120 and the HPF 130 are also 50 ohm for impedance matching with the nominal impedance 50 ohm.

Figure 2:
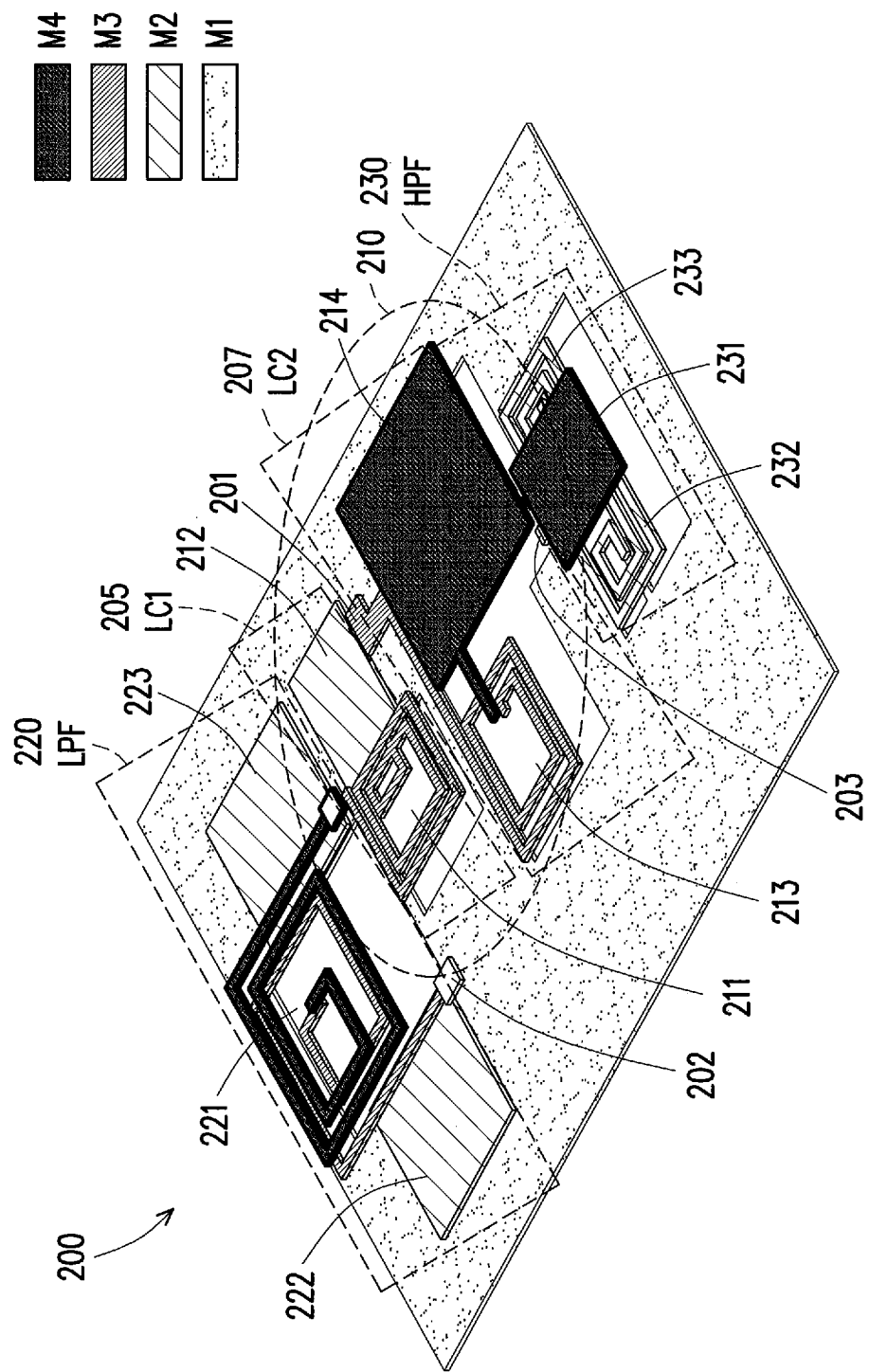
FIG. 2 is a schematic illustration an on-chip diplexer layout, in accordance with some embodiments.

FIG. 2 is a schematic illustration of an on-chip diplexer layout 200 corresponding to the circuit illustrated in FIG. 1, in accordance with some embodiments. According to some embodiments, an on-chip diplexer circuit layout 200 is deployed within a semiconductor package. The on-chip diplexer circuit layout 200 includes an antenna port 201, a low band port 202 and a high band port 203. The on-chip diplexer circuit 200 includes at least a first metal layer M1, a second metal layer M2, a third metal layer M3 and a fourth metal layer M4.

The on-chip diplexer circuit 200 also includes a low pass filter (LPF) 220 deployed on the second layer M2, the third layer M3 and the fourth layer M4, in accordance with some embodiments. The LPF 220 includes an inductor on M3 and M4 layers, two capacitors 222 and 223 both on M2 layers. The on-chip diplexer circuit layout 200 also includes a first LC resonator unit 205 deployed on the second layer M2 and the third layer M3, in accordance with some embodiments. The first LC resonator unit 205 includes an inductor 211 on M3 layer and a capacitor 212 on M2 layer. The on-chip diplexer circuit layout 200 also includes a second LC resonator unit 230 deployed on the third layer M3 and the fourth layer M4, in accordance with some embodiments. The second LC resonator unit 207 includes an inductor 213 on M3 layer and a capacitor 214 on M4 layer. The on-chip diplexer circuit layout 200 further includes a high pass filter (HPF) 230 deployed on the second layer M2, the third layer M3 and the fourth layer M4, in accordance with some embodiments. The HPF 230 includes a capacitor 231 on M4 layer and two inductors 232 and 233 both on M2 layer. According to some embodiments, the on-chip diplexer circuit layout 200 with matching network achieves low insertion loss, high inactive-channel suppression and good port-to-port isolation with fewer elements integrated in a compact size.

Figure 3:
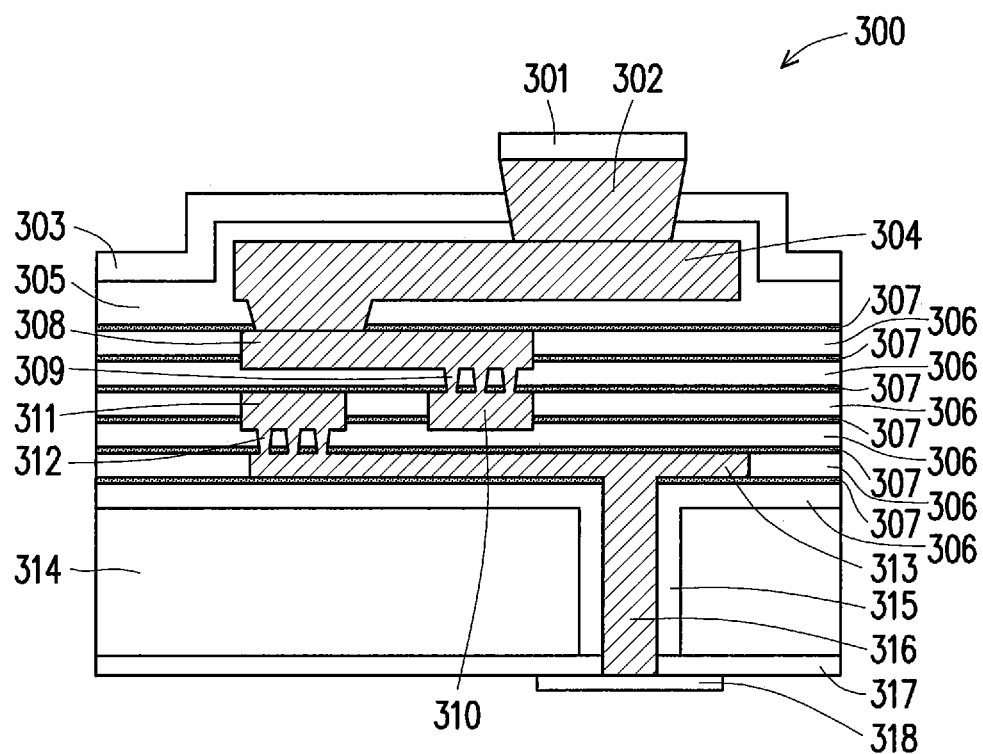
FIG. 3 is a cross sectional view of an on-chip diplexer with interposer RDL layers, in accordance with some embodiments.

FIG. 3 is a cross sectional view of an on-chip diplexer with interposer redistribution layers (RDLs), in accordance with some embodiments. According to some embodiments, the CoWos interposer profile includes a micro bump 301, and a bump 302, a passivation layer 303 for water proofing, an aluminum redistribution layer (RDL) 304, an oxide layer 305, a plurality of dielectric layers 306 and 307, an M3 metal layer 308, vias 309, M2 metal layers 310 and 311, vias 312, an M1 metal layer 313, a silicon substrate 314, a TSV liner oxide 315, an inter connector 316, a SiN layer 317, and a bottom pad 318. Further details of the structure will be discussed in FIG. 4.

According to some embodiments, the metal thickness & ratios are: $t_{M1}=t_{M2} \leq t_{M3}$, where $t_{M1}$ stands for the thickness of the M1 layer, $t_{M2}$ stands for the thickness of the M2 layer, $t_{M3}$ stands for the thickness of the M3 layer; $1 < t_{M1}/t_{M3} < 10$, which means that the ratio between the thickness of the M1 layer and the M3 layer is between 1 and 10; $0.2 < \text{width/space}(M3) < 5$, which means that the M3 metal 407 width and space ratio is between 0.2 and 5; 0.2<width/space (M2)<5, which means that the M2 metal 410 width and space ratio is between 0.2 and 5; 0.2<width/space (M1)<5, which means that the M1 metal 412 width and space ratio is between 0.2 and 5; 0.5<width/space (V2)<2, which means that the width and space ratio of the via 406 is between 0.5 and 2; 0.5<width/space (V1)<2, which means that the width and space ratio of the via 409 is between 0.5 and 2; 0.1<width/space (TSV)<2, which means that the width and space ratio of the through-silicon via 413 is between 0.5 and 2.

Figure 4:
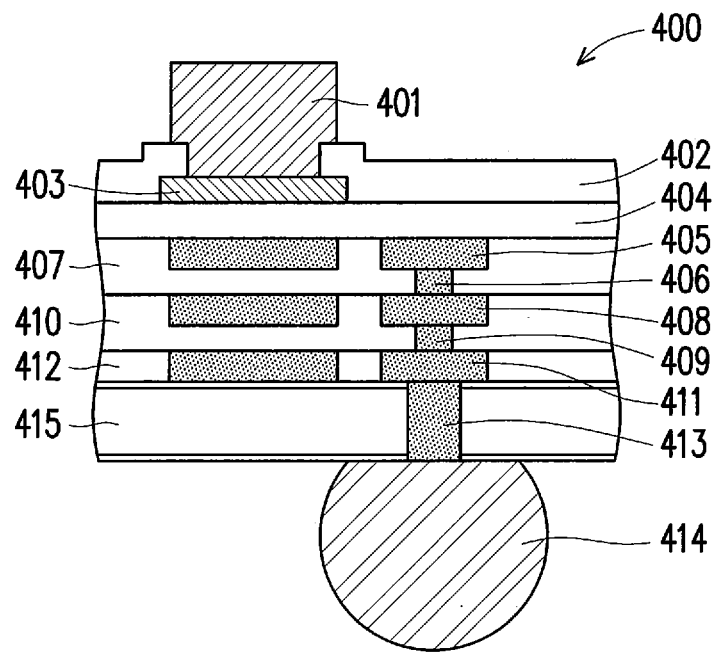
FIG. 4 is a cross sectional view of a Si interposer, in accordance with some embodiments.

FIG. 4 is a cross sectional view of a Si interposer 400 fabricated using CoWos techniques, in accordance with some embodiments. According to some embodiments, the front side of the silicon interposer 400 includes three metal layers: M1 (412), M2 (410) and M3 (407). According to some embodiments, the front side of interposer 400 also includes an aluminum redistribution layer 403 and micro bump 401. According to some embodiments, the front side of interposer 400 also includes passivation layers 402 and 404, vias 406 and 409, additional metal layers 411, 408, and 405 in M1, M2 and M3 layers respectively. The through-silicon via ("TSV") 413 penetrates the silicon substrate layer 415 to electrically connect the metal layer 411 to a flip-chip bump 414. According to some embodiments, the back side of the silicon interposer 400 includes the flip-chip bump 414.

According to some embodiments, 0.5 um<passivation<5 um, which means that the thickness of the passivation layers 402 and 404 are between 0.5 um and 5 um; 0.5 um<RV (top via)<2 um, which means that the thickness of the top via, such as the first via 409 and the second via 406 is between 0.5 um and 2 um; 0.1 um<Via~0.62 um<2 urn, which means that the thickness of the first via 409 and the second via 406 is around 0.62 um and between 0.1 um and 2 um; 0.5 um<thickness of M1<3 um, which means that the thickness of the M1 layer is between 0.5 um and 3 um; 0.5 um<thickness of M2<3 um, which means that the thickness of the M2 layer is between 0.5 um and 3 um; 0.5 um<thickness of M3<5 um, which means that the thickness of the M3 layer is between 0.5 um and 5 um; 20 um<thickness of TSV<200 um, which means that the thickness of the TSV is between 20 um and 200 um.

Figure 5A:
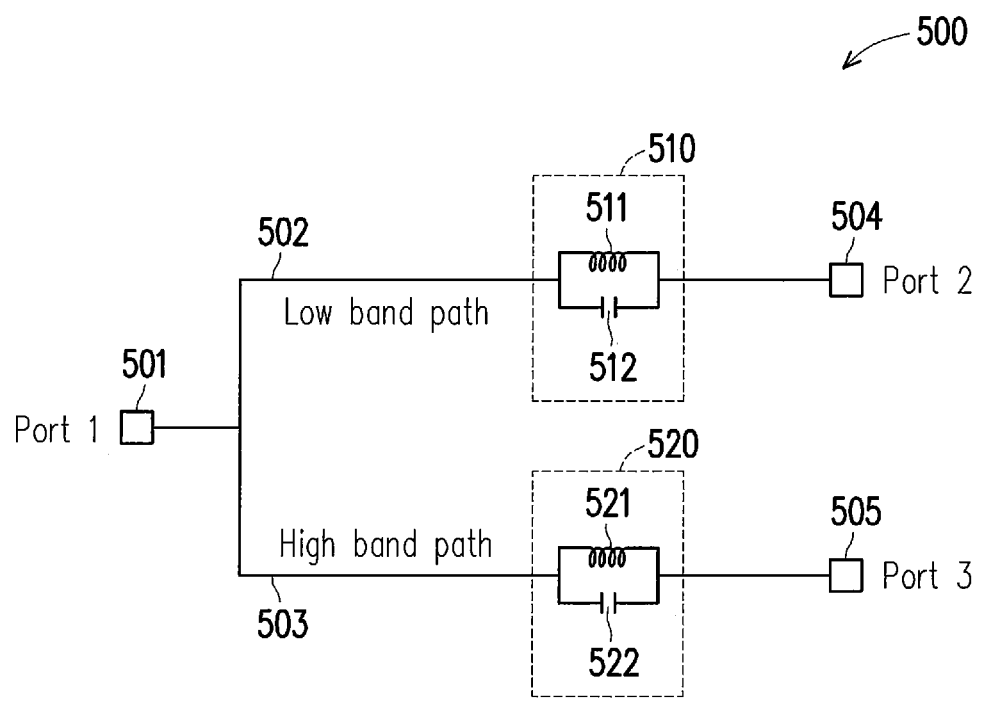
FIG. 5A is a schematic illustration of an embodiment of a dual-mode three port matching circuit, in accordance with some embodiments.

FIG. 5A is a schematic illustration of an embodiment of a dual-mode three port matching circuit 500, in accordance with some embodiments. According to some embodiments, the dual-mode three port matching circuit 500 includes a first port 501, which is connected to a first LC resonator unit 510 through a low band path 502 and connected to a second LC resonator unit 520 through a high band path 503. The dual-mode three port matching circuit 500 also includes a second port 504, which is electrically connected to the first LC resonator unit 510, and a third port 505, which is electrically connected to the second LC resonator unit 520. According to some embodiments, the first LC resonator unit 510 includes a first inductor 511 and a first capacitor 512 electrically connected in parallel. According to some embodiments, the second LC resonator unit 520 includes a second inductor 521 and a second capacitor 522 electrically connected in parallel.

Figure 5B:
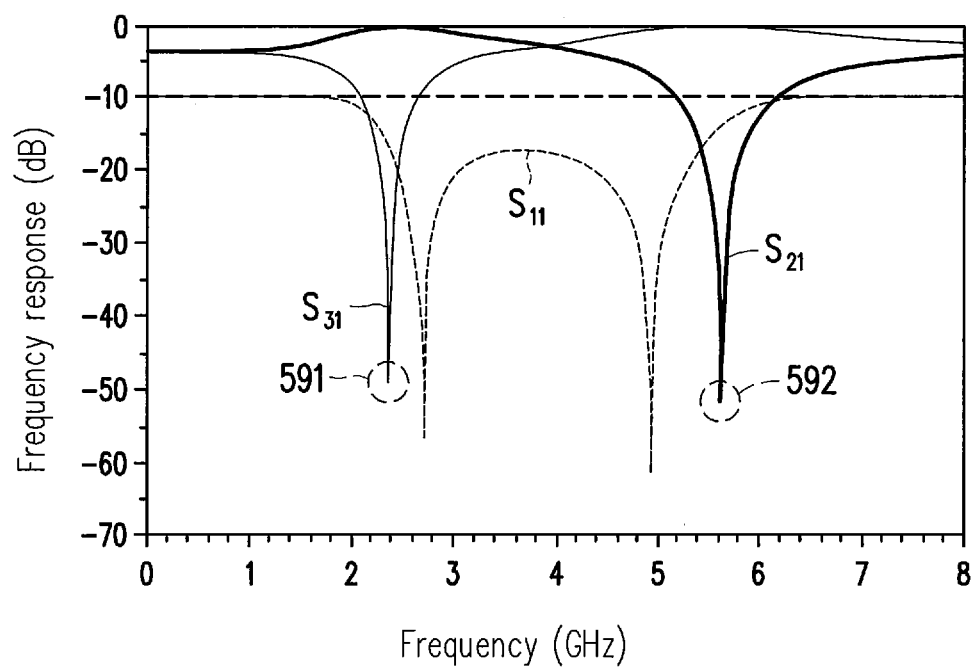
FIG. 5B is a corresponding figure illustrating scattering parameters of the dual-mode three port matching circuit, in accordance with some embodiments.

FIG. 5B is a corresponding figure illustrating scattering parameters of the dual-mode three port matching circuit 500 in FIG. 5A, in accordance with some embodiments. According to some embodiments, the x-axis represents frequency in GHz and the y-axis represents corresponding frequency response in dB. According to some embodiments, $S_{31}$ represents a relationship between a frequency response of a reflected power wave at the port 3 (505) and a frequency of a corresponding incident power wave at the port 1 (501) in FIG. 5A; $S_{21}$ represents a relationship between a frequency response of a reflected power wave at the port 2 (504) and a frequency of a corresponding incident power wave at the port 1 (501) in FIG. 5A; and $S_{11}$ represents a relationship between a frequency of an incident power wave at the port 1 (501) and a frequency response of a corresponding reflected power wave at the port 1 (501) itself in FIG. 5A. It can be understood that when the dual-mode three port matching circuit 500 is reciprocal, $S_{31}=S_{13}$, and $S_{21}=S_{12}$.

According to some embodiments, the low band suppression 591 of the scattering parameter $S_{31}$ is located at 2.4 GHz, and the high band suppression 592 of the scattering parameter $S_{21}$ is located at 5.8 GHz. As shown in FIG. 5B, the frequency 2.4 GHz falls into a passband of $S_{21}$ with almost 0 dB insertion loss, but is isolated by $S_{31}$ with a loss of more than 40 dB. This means a 2.4 GHz signal generated at port 1 can well pass through port 2 but cannot pass port 3. Similarly, as shown in FIG. 5B, the frequency 5.8 GHz falls into a passband of $S_{31}$ with almost 0 dB insertion loss, but is isolated by $S_{21}$ with a loss of more than 40 dB. This means a 5.8 GHz signal generated at port 1 can well pass through port 3 but cannot pass port 2. This enables the diplexer to split signals received from the port 1. For example, a transmitter and a receiver may be connected to port 2 and port 3 respectively, and work at 2.4 GHz and 5.8 GHz respectively, without interfering each other.

In addition, as shown in FIG. 5B, the input return loss $S_{11}$ is greater than 10 dB in a wide frequency range from 1.8 GHz to 6.4 GHz. This means most energy of the incident power wave, with a frequency from 1.8 GHz to 6.4 GHz, at port 1 can pass to either port 2 or port 3 instead of being reflected back to port 1.

Figure 6A:
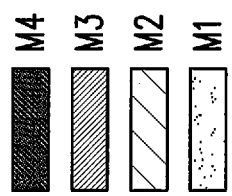
FIG. 6A is a schematic illustration of the layout of a low pass filter, in accordance with some embodiments.
Figure 6A:
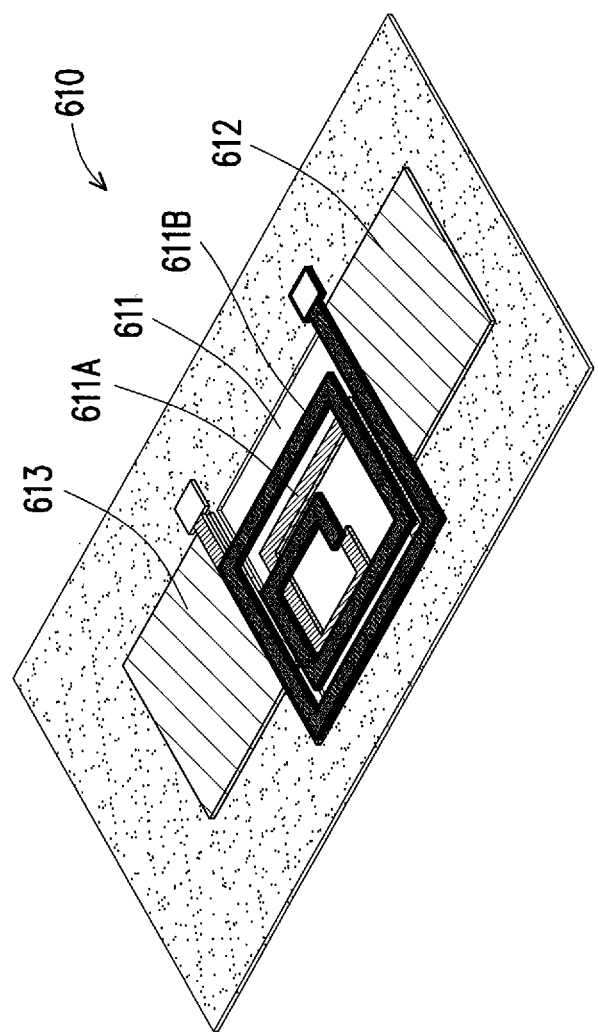

FIG. 6A is a schematic illustration of the layout of a low pass filter, in accordance with some embodiments. According to some embodiments, the layout of the low pass filter 610 includes an inductor 611 with a first sub-inductor 611A deployed on the third layer M3 and a second sub-inductor 611B deployed on the fourth layer M4, a first capacitor 612 and a second capacitor 613 both deployed on the second layer M2. The first sub-inductor 611A and the second sub-inductor 611B are interconnected between layers M3 and M4 to form the inductor 611. The corresponding low pass filter circuit is illustrated in FIG. 6B.

Figure 6B:
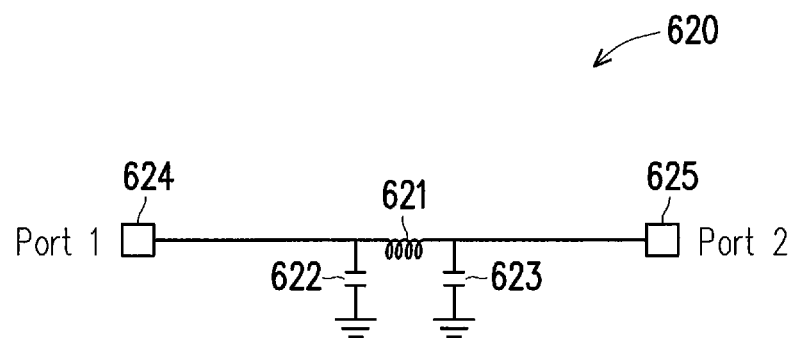
FIG. 6B is a schematic illustration of a corresponding low pass filter circuit, in accordance with some embodiments.

FIG. 6B is a schematic illustration of a corresponding low pass filter circuit, in accordance with some embodiments. According to some embodiments, the low pass filter circuit 620 corresponds to the layout 610 illustrated in FIG. 6A. According to some embodiments, the low pass filter circuit 620 includes an inductor 621, a first capacitor 622, a second capacitor 623, a first port 624 and a second port 625. The first capacitor 622 is electrically connected between one side of the inductor 621 and the ground, the second capacitor 623 is electrically connected between the other side of the inductor 621 and the ground. The corresponding frequency response is illustrated in FIG. 6C.

Figure 6C:
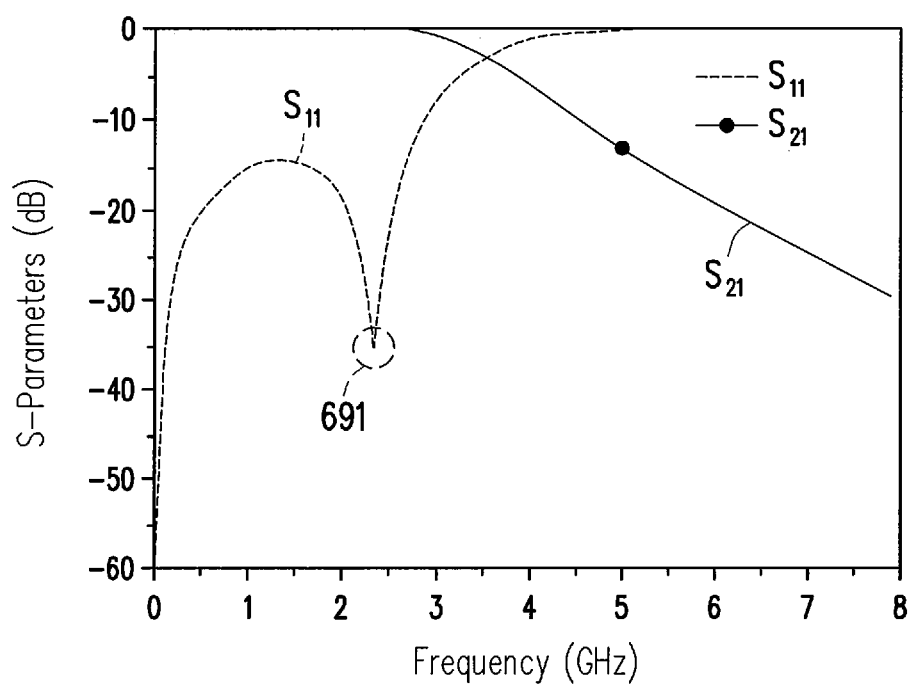
FIG. 6C is a corresponding figure illustrating scattering parameters of the low pass filter circuit, in accordance with some embodiments.

FIG. 6C is a corresponding figure illustrating scattering parameters of the low pass filter circuit in FIG. 6B, in accordance with some embodiments. According to some embodiments, $S_{21}$ represents a relationship between a frequency response of a reflected power wave at the port 2 (625) and a frequency of a corresponding incident power wave at the port 1 (624) in FIG. 6B; $S_{11}$ represents a relationship between a frequency of an incident power wave at the port 1 (624) and a frequency response of a corresponding reflected power wave at the port 1 (624) itself in FIG. 6B. In some embodiments, the low band suppression 2.4 GHz of $S_{11}$ is located at point 691 in FIG. 6C, with a loss of more than 30 dB. This means most energy of the incident power wave of a frequency 2.4 GHz at port 1 can pass to port 2 instead of being reflected back to port 1.

Figure 7A:
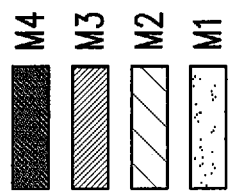
FIG. 7A is a schematic illustration of the layout of a high pass filter, in accordance with some embodiments.
Figure 7A:
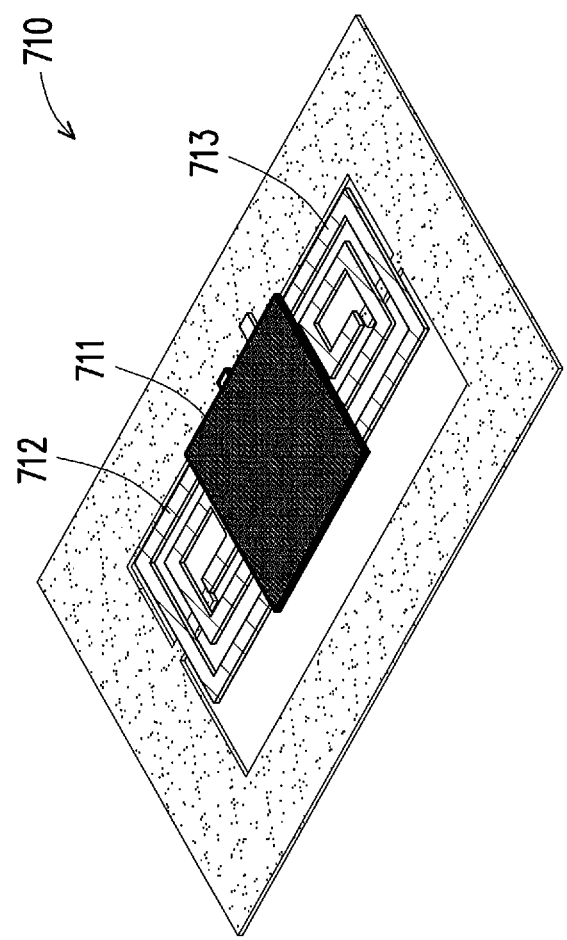

FIG. 7A is a schematic illustration of the layout of a high pass filter, in accordance with some embodiments. According to some embodiments, the layout of the high pass filter 710 includes a capacitor 711 deployed on the fourth layer M4, a first inductor 712 and a third capacitor 713 both deployed on the second layer M2.

Figure 7B:
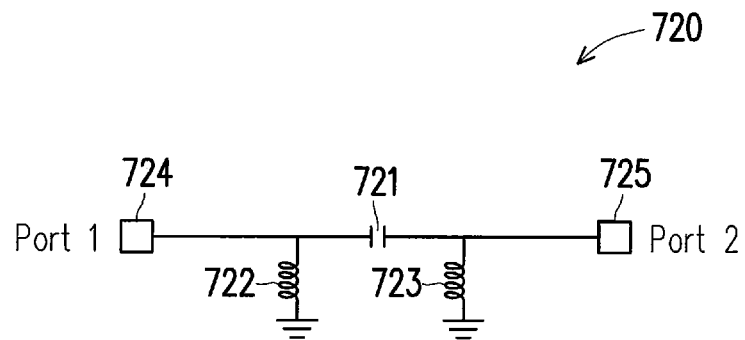
FIG. 7B is a schematic illustration of a corresponding high pass filter circuit, in accordance with some embodiments.

FIG. 7B is a schematic illustration of a corresponding high pass filter circuit, in accordance with some embodiments. According to some embodiments, the high pass filter circuit 720 corresponds to the layout 710 illustrated in FIG. 7A. According to some embodiments, the high pass filter circuit 720 includes a capacitor 721, a first inductor 722, a second inductor 723, a first port 724 and a second port 725. The first inductor 722 is electrically connected between one side of the capacitor 721 and the ground, the second inductor 723 is electrically connected between the other side of the capacitor 721 and the ground. The corresponding frequency response is illustrated in FIG. 7C.

Figure 7C:
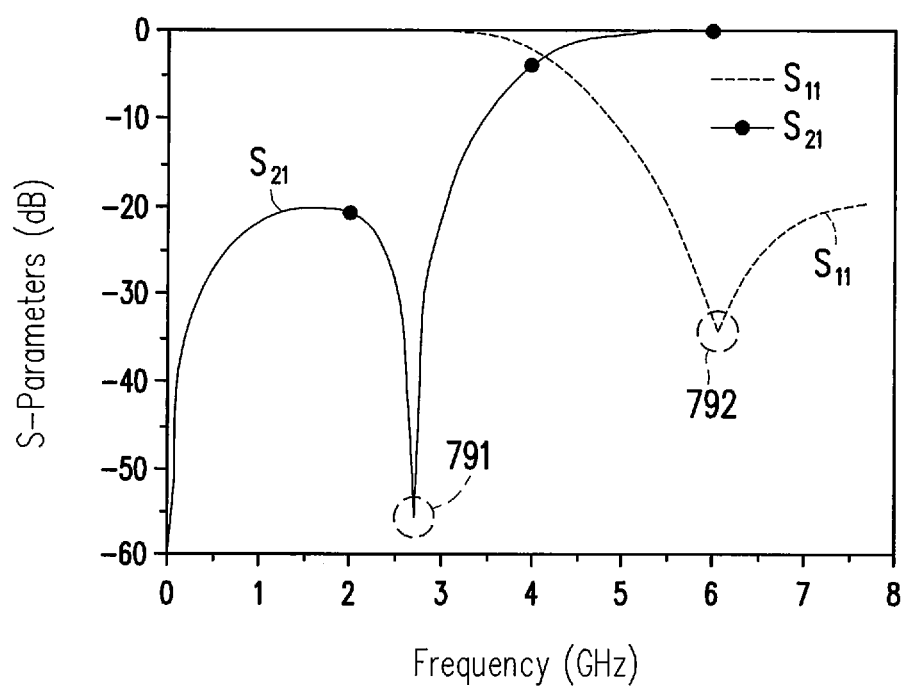
FIG. 7C illustrates scattering parameters of the high pass filter circuit of FIG. 7B, in accordance with some embodiments.

FIG. 7C is a corresponding figure illustrating scattering parameters of the high pass filter circuit, in accordance with some embodiments. According to some embodiments, $S_{21}$ represents a relationship between a frequency response of a reflected power wave at the port 2 (725) and a frequency of a corresponding incident power wave at the port 1 (724) in FIG. 7B, $S_{11}$ represents a relationship between a frequency of an incident power wave at the port 1 (724) and a frequency response of a corresponding reflected power wave at the port 1 (724) itself in FIG. 7B. The low band suppression 2.4 GHz of $S_{21}$ is located at 791 with a loss of more than 50 dB, and the high band suppression 5.8 GHz of $S_{11}$ is located at 792 with a loss of more than 30 dB, in FIG. 7C.

Figure 8A:
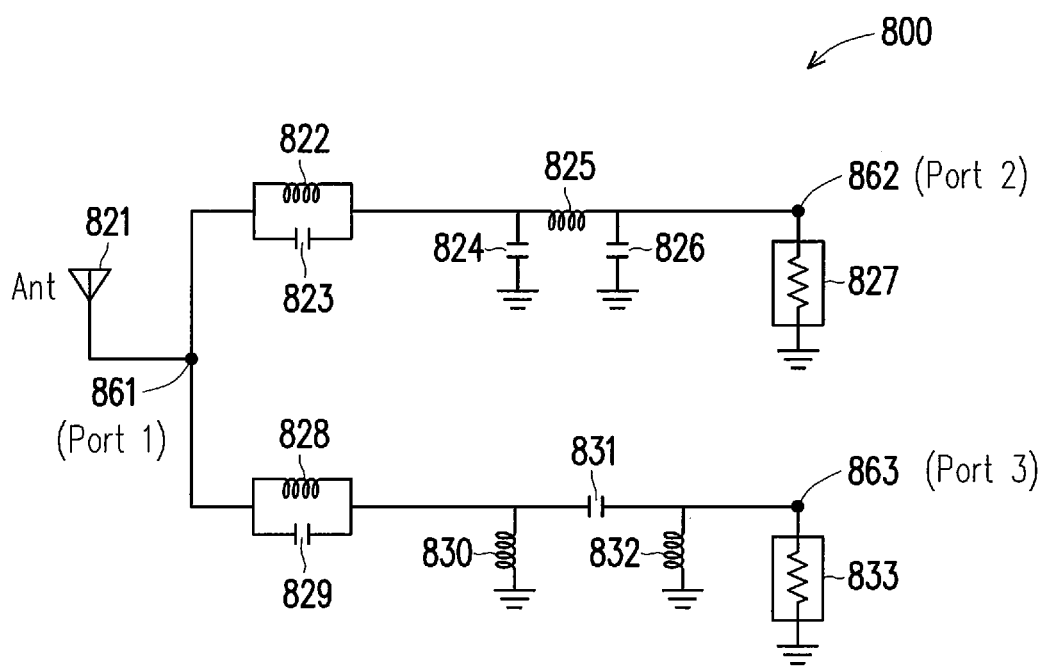
FIG. 8A is a schematic illustration of an on-chip diplexer circuit, in accordance with some embodiments.

FIG. 8A is a schematic illustration of an on-chip diplexer circuit 800, in accordance with some embodiments. According to some embodiments, the on-chip diplexer circuit 800 corresponds to the layout 200 in FIG. 2, and is similar to the circuit 100 illustrated in FIG. 1. In addition to the elements already illustrated in FIG. 1, an antenna 821 is electrically connected to the antenna port 101, a first resister 827 is electrically connected between the port 102 and the ground, and a second resister 833 is electrically connected between the port 103 and the ground. The corresponding scattering parameters are illustrated in FIG. 8B.

Figure 8B:
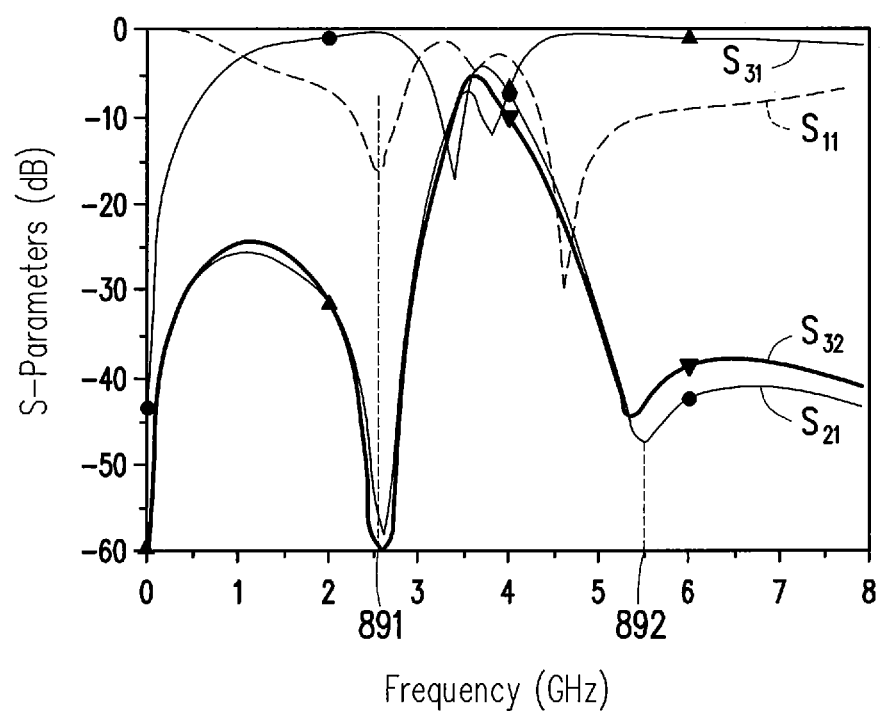
FIG. 8B illustrates scattering parameters of the on-chip diplexer circuit of FIG. 8A, in accordance with some embodiments.

FIG. 8B is a corresponding figure illustrating scattering parameters of the on-chip diplexer circuit 800, in accordance with some embodiments. According to some embodiments, $S_{31}$ represents a relationship between a frequency response of a reflected power wave at the port 3 (863) and a frequency of a corresponding incident power wave at the port 1 (861) in FIG. 8A, $S_{11}$ represents a relationship between a frequency of an incident power wave at the port 1 (861) and a frequency response of a corresponding reflected power wave at the port 1 (861) itself in FIG. 8A, $S_{32}$ represents a relationship between a frequency response of a reflected power wave at the port 3 (863) and a frequency of a corresponding incident power wave at the port 2 (862) in FIG. 8A, $S_{21}$ represents a relationship between a frequency response of a reflected power wave at the port 2 (862) and a frequency of a corresponding incident power wave at the port 1 (861) in FIG. 8A. The low band suppression 2.4 GHz of $S_{32}$ and $S_{21}$ is located at 891, and the high band suppression 5.8 GHz of $S_{32}$ and $S_{21}$ is located at 892 in FIG. 8B.

Figure 9:
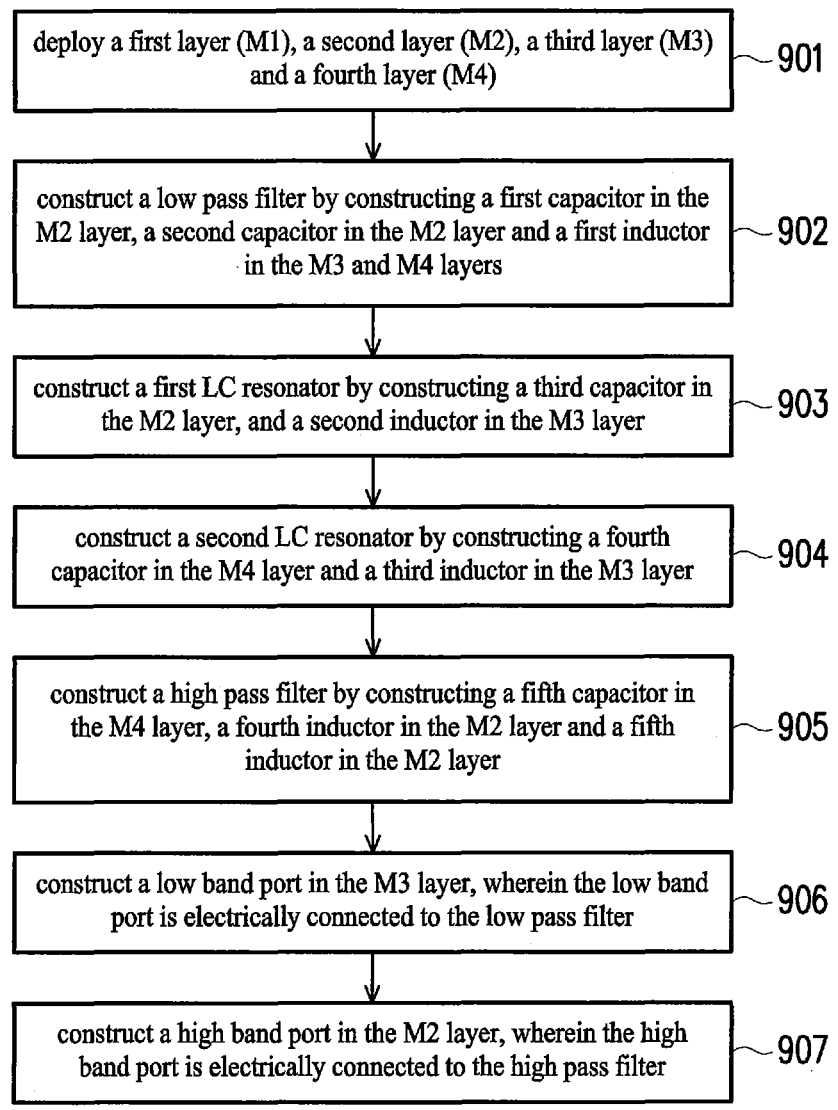
FIG. 9 is a flowchart illustrating a method for constructing an on-chip diplexer circuit using Chip-On-Wafer-On-Substrate (CoWos) techniques, in accordance with some embodiments.

FIG. 9 is a flowchart illustrating a method for constructing an on-chip diplexer circuit using Chip On Wafer On Substrate (CoWos) techniques, in accordance with some embodiments. According to some embodiments, at step 901, the method includes deploying a first layer (M1), a second layer (M2), a third layer (M3) and a fourth layer (M4). At step 902, the method includes constructing a low pass filter by constructing a first capacitor in the M2 layer, a second capacitor in the M2 layer and a first inductor in the M3 and M4 layers. At step 903, the method includes constructing a first LC resonator by constructing a third capacitor in the M2 layer, and a second inductor in the M3 layer. At step 904, the method includes constructing a second LC resonator by constructing a fourth capacitor in the M4 layer and a third inductor in the M3 layer. At step 905, the method includes constructing a high pass filter by constructing a fifth capacitor in the M4 layer, a fourth inductor in the M2 layer and a fifth inductor in the M2 layer. At step 906, the method further includes constructing a low band port in the M3 layer, the low band port is electrically connected to the low pass filter. At step 907, the method includes constructing a high band port in the M2 layer, the high band port is electrically connected to the high pass filter.

According to some embodiments, an on-chip diplexer circuit is disclosed. The on-chip diplexer circuit includes a LC resonator module, the LC resonator module further comprises a first port, a first LC resonator unit and a second LC resonator unit; a first filter unit, the first filter unit is electrically connected to the first LC resonator unit in the LC resonator module, and the first filter unit is electrically connected to a second port; and a second filter unit, the second filter unit is electrically connected to the second LC resonator unit in the LC resonator module, and the second filter unit is electrically connected to a third port. The first LC resonator unit serves as an impedance matching circuit for a first signal having a first resonant frequency and serves as an open circuit for a second signal having a second resonant frequency that is different from the first resonant frequency. The second LC resonator unit serves as an impedance matching circuit for the second signal having the second resonant frequency and serves as an open circuit for the first signal having the first resonant frequency. The first filter unit passes signals with the first resonant frequency; and the second filter unit passes signals with the second resonant frequency.

According to some embodiments, the first LC resonator unit in the LC resonator module further includes a first inductor and a first capacitor, the first inductor and the first capacitor are connected in parallel. According to some embodiments, the second LC resonator unit in the LC resonator module further includes a second inductor and a second capacitor, the second inductor and the second capacitor are connected in parallel. According to some embodiments the first filter unit is a low pass filter (LPF). According to some embodiments, the second filter unit is a high pass filter (HPF). According to some embodiments, the LPF further includes a third inductor, a third capacitor and a fourth capacitor, the third capacitor is electrically connected between a first side of the third inductor and the ground, the fourth capacitor is electrically connected between a second side of the third inductor and the ground. According to some embodiments, the HPF further includes a fifth capacitor, a fourth inductor and a fifth inductor, the fourth inductor is electrically connected between a first side of the fifth capacitor and the ground, the fifth inductor is electrically connected between a second side of the fifth capacitor and the ground. According to some embodiments, the first port is an antenna port.

According to some embodiments, an on-chip diplexer circuit deployed within a semiconductor package is disclosed. According to some embodiments, the on-chip diplexer circuit deployed within a semiconductor package includes at least a first, a second, a third and a fourth layers; a low pass filter (LPF) deployed on the second, the third and the fourth layers; a first LC resonator unit deployed on the second and the third layers; a second LC resonator unit deployed on the third and the fourth layers; and a high pass filter (HPF) deployed on the second, the third and the fourth layers. The first LC resonator unit provides a first resonant frequency; and the second LC resonator unit provides a second resonant frequency that is higher the first resonant frequency. The low pass filter passes signals with the first resonant frequency; and the high pass filter passes signals with the second resonant frequency.

According to some embodiments, the low pass filter further comprises a first inductor deployed on the third and the fourth layers, a first capacitor deployed on the second layer and a second capacitor deployed on the second layer. According to some embodiments, the first LC resonator unit further comprises a second inductor deployed on the third layer, and a third capacitor deployed on the second layer. According to some embodiments, the second LC resonator unit further comprises a third inductor deployed on the third layer, and a fourth capacitor deployed on the fourth layer. According to some embodiments, the high pass filter further comprises a fifth capacitor deployed on the fourth layer, a fourth inductor deployed on the second layer and the fifth inductor deployed on the second layer. According to some embodiments, the on-chip diplexer circuit deployed within a semiconductor package further includes a low-band port, a high-band port, and an antenna port.

According to some embodiments, a method for constructing an on-chip diplexer circuit using Chip On Wafer On Substrate (CoWos) is disclosed. According to some embodiments, the method includes a first step 901 of deploying a first layer (M1), a second layer (M2), a third layer (M3) and a fourth layer (M4); a second step 902 of constructing a low pass filter by constructing a first capacitor in the M2 layer, a second capacitor in the M2 layer and a first inductor in the M3 and M4 layers; a third step 903 of constructing a first LC resonator by constructing a third capacitor in the M2 layer, and a second inductor in the M3 layer; a fourth step 904 of constructing a second LC resonator by constructing a fourth capacitor in the M4 layer and a third inductor in the M3 layer; and a fifth step 905 of constructing a high pass filter by constructing a fifth capacitor in the M4 layer, a fourth inductor in the M2 layer and a fifth inductor in the M2 layer. The first LC resonator provides a first resonant frequency; and the second LC resonator provides a second resonant frequency that is higher the first resonant frequency. The low pass filter passes signals with the first resonant frequency; and the high pass filter passes signals with the second resonant frequency.

According to some embodiments, the method further includes a sixth step 906 of constructing a low band port in the M3 layer, the low band port is electrically connected to the low pass filter. According to some embodiments, the method further includes a seventh step 907 of constructing a high band port in the M2 layer, wherein the high band port is electrically connected to the high pass filter. According to some embodiments, the method further includes the step of constructing an antenna port in the M3 layer, the antenna port is electrically connected to both the second inductor in the first LC resonator and the third inductor in the second LC resonator. According to some embodiments, the method further includes the step of electrically connecting the low pass filter with the first LC resonator. According to some embodiments, the method further includes the step of electrically connecting the high pass filter with the second LC resonator.

According to some embodiments, a method for constructing an on-chip diplexer circuit using Chip On Wafer On Substrate (CoWos) is disclosed. The method includes the steps of deploying a first layer (M1), a second layer (M2), a third layer (M3) and a fourth layer (M4); constructing a low pass filter by constructing a first capacitor in the M2 layer, a second capacitor in the M2 layer and a first inductor in the M3 and M4 layers; constructing a first LC resonator by constructing a third capacitor in the M2 layer, and a second inductor in the M3 layer; constructing a second LC resonator by constructing a fourth capacitor in the M4 layer and a third inductor in the M3 layer; and constructing a high pass filter by constructing a fifth capacitor in the M4 layer, a fourth inductor in the M2 layer and a fifth inductor in the M2 layer. According to some embodiments, the method further includes constructing a low band port in the M3 layer, the low band port is electrically connected to the low pass filter. According to some embodiments, constructing a high band port in the M2 layer, the high band port is electrically connected to the high pass filter.

According to some embodiments, an interposer device is disclosed. The device includes a first metal layers M1, a second metal layer M2 and a third metal layer M3; an aluminum redistribution layer; a micro bump; a first passivation layer and a second passivation layer; a first via V1; a second via V2; a through-silicon via TSV, wherein $t_{M1}=t_{M2}<t_{M3}$, where $t_{M1}$ stands for the thickness of the M1 layer, $t_{M2}$ stands for the thickness of the M2 layer, $t_{M3}$ stands for the thickness of the M3 layer; $1<t_{M1}/t_{M3}<10$, which means that the ratio between the thickness of the M1 layer and the M3 layer is between 1 and 10; $0.2<$width/space (M3)$<5$, which means that the M3 metal 407 width and space ratio is between 0.2 and 5; $0.2<$width/space (M2)$<5$, which means that the M2 metal 410 width and space ratio is between 0.2 and 5; $0.2<$width/space (M1)$<5$, which means that the M1 metal 412 width and space ratio is between 0.2 and 5; $0.5<$width/space (V2)$<2$, which means that the width and space ratio of the via 406 is between 0.5 and 2; $0.5<$width/space (V1)$<2$, which means that the width and space ratio of the via 409 is between 0.5 and 2; $0.1<$width/space (TSV)$<2$, which means that the width and space ratio of the through-silicon via 413 is between 0.5 and 2.

According to some embodiments, 0.5 um<passivation<5 um, which means that the thickness of the passivation layer is between 0.5 um and 5 um; 0.5 um<RV (top via)<2 um, which means that the thickness of the top via is between 0.5 um and 2 um; 0.1 um<Via~0.62 um<2 um, which means that the thickness of the first via and the second via is around 0.62 um and between 0.1 um and 2 um; 0.5 um<thickness of M1<3 um, which means that the thickness of the M1 layer is between 0.5 um and 3 um; 0.5 um<thickness of M2<3 um, which means that the thickness of the M2 layer is between 0.5 um and 3 um; 0.5 um<thickness of M3<5 um, which means that the thickness of the M3 layer is between 0.5 um and 5 um; 20 um<thickness of TSV<200 um, which means that the thickness of the TSV is between 20 um and 200 um.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
an inductance and capacitance (LC) resonator module comprising a plurality of layers, wherein the LC resonator module further comprises
a first LC resonator unit that comprises a first capacitor and serves as an impedance matching circuit for a first signal having a first resonant frequency and serves as an open circuit for a second signal having a second resonant frequency, and
a second LC resonator unit that comprises a second capacitor and serves as an impedance matching circuit for the second signal having the second resonant frequency and serves as an open circuit for the first signal having the first resonant frequency, wherein the first capacitor and the second capacitor are deployed on different layers of the plurality of layers;
a first filter that passes signals with the first resonant frequency, wherein
the first filter comprises a third inductor, a third capacitor and a fourth capacitor,
the third capacitor is electrically coupled between a first side of the third inductor and the ground, and
the fourth capacitor is electrically coupled between a second side of the third inductor and the ground; and
a second filter that passes signals with the second resonant frequency.

2. The circuit of claim 1, wherein the first resonant frequency is higher than the second resonant frequency.

3. The circuit of claim 2, wherein the first filter is a high pass filter and the second filter is a low pass filter.

4. The circuit of claim 1, wherein the first resonant frequency is lower than the second resonant frequency.

5. The circuit of claim 4, wherein the first filter is a low pass filter and the second filter is a high pass filter.

6. The circuit of claim 5, wherein the high pass filter further comprises a fifth capacitor, a fourth inductor and a fifth inductor, wherein the fourth inductor is electrically coupled between a first side of the fifth capacitor and the ground, wherein the fifth inductor is electrically coupled between a second side of the fifth capacitor and the ground.

7. The circuit of claim 1, wherein:
the LC resonator module further comprises a first port;
the first filter is electrically coupled to the first LC resonator unit and electrically coupled to a second port;
the second filter is electrically coupled to the second LC resonator unit and electrically coupled to a third port;
the first port provides an antenna port;
the second port provides a low band port; and
the third port provides a high band port.

8. An on-chip diplexer circuit, comprising:
at least a first, a second, a third and a fourth layers;
a low pass filter (LPF) deployed on the second, the third and the fourth layers;
a first inductance and capacitance (LC) resonator unit deployed on the second and the third layers;
a second inductance and capacitance (LC) resonator unit deployed on the third and the fourth layers; and
a high pass filter (HPF) deployed on the second, the third and the fourth layers.

9. The on-chip diplexer circuit of claim 8, wherein the low pass filter further comprises a first inductor deployed on the third and the fourth layers, a first capacitor deployed on the second layer and a second capacitor deployed on the second layer.

10. The on-chip diplexer circuit of claim 8, wherein the first LC resonator unit is configured for providing a first resonant frequency and further comprises a second inductor deployed on the third layer, and a third capacitor deployed on the second layer.

11. The on-chip diplexer circuit of claim 10, wherein the second LC resonator unit is configured for providing a second resonant frequency higher than the first resonant frequency and further comprises a third inductor deployed on the third layer, and a fourth capacitor deployed on the fourth layer.

12. The on-chip diplexer circuit of claim 8, wherein the high pass filter further comprises a fifth capacitor deployed on the fourth layer, a fourth inductor deployed on the second layer and the fifth inductor deployed on the second layer.

13. The on-chip diplexer circuit of claim 8, further comprises a low-band port, a high-band port, and an antenna port.

14. A method for constructing an on-chip diplexer circuit, the method comprising:
deploying a first layer (M1), a second layer (M2), a third layer (M3) and a fourth layer (M4);
constructing a low pass filter by constructing a first capacitor in the M2 layer, a second capacitor in the M2 layer and a first inductor in the M3 and M4 layers;
constructing a first inductance and capacitance (LC) resonator by constructing a third capacitor in the M2 layer, and a second inductor in the M3 layer;
constructing a second inductance and capacitance (LC) resonator by constructing a fourth capacitor in the M4 layer and a third inductor in the M3 layer; and
constructing a high pass filter by constructing a fifth capacitor in the M4 layer, a fourth inductor in the M2 layer and a fifth inductor in the M2 layer.

15. The method of claim 14, further comprising the step of:
constructing a low band port in the M3 layer, wherein the low band port is electrically connected to the low pass filter.

16. The method of claim 14, further comprising the step of:
constructing a high band port in the M2 layer, wherein the high band port is electrically connected to the high pass filter.

17. The method of claim 14, further comprising the step of:
constructing an antenna port in the M3 layer, wherein the antenna port is electrically connected to both the second inductor in the first LC resonator and the third inductor in the second LC resonator.

18. The method of claim 14, further comprising the step of:
electrically connecting the low pass filter with the first LC resonator.

19. The method of claim 14, further comprising the step of:
electrically connecting the high pass filter with the second LC resonator.

* * * * *